US006263301B1

(12) United States Patent
Cox et al.

(10) Patent No.: US 6,263,301 B1
(45) Date of Patent: Jul. 17, 2001

(54) METHOD AND APPARATUS FOR STORING AND VIEWING DATA GENERATED FROM A COMPUTER SIMULATION OF AN INTEGRATED CIRCUIT

(75) Inventors: Steven G. Cox; James M. Gallo, both of Boulder, CO (US); Mark Glasser, Redwood City, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/136,378

(22) Filed: Aug. 19, 1998

(51) Int. Cl.[7] .................................................. G06F 17/50
(52) U.S. Cl. ............................... 703/14; 703/16; 703/19; 702/67; 716/5
(58) Field of Search .................................. 703/13, 22, 14, 703/15, 16, 19; 716/4, 5, 6; 702/66, 67, 68, 71

(56) References Cited

U.S. PATENT DOCUMENTS

| | | | |
|---|---|---|---|
| 5,576,979 | * 11/1996 | Lewis et al. .............................. | 716/6 |
| 5,715,433 | 2/1998 | Raghavan et al. .................... | 395/500 |
| 5,752,000 | 5/1998 | McGeer et al. ....................... | 395/500 |
| 5,758,123 | * 5/1998 | Sano et al. .............................. | 703/22 |
| 5,905,883 | * 5/1999 | Kasuya ................................... | 703/17 |
| 5,937,182 | * 8/1999 | Allingham ............................. | 703/13 |
| 6,009,256 | * 12/1999 | Tseng et al. ............................ | 703/13 |
| 6,073,194 | * 6/2000 | Lowe ...................................... | 703/13 |

OTHER PUBLICATIONS

Meyer, A. S., "A Loosely Coupled C/Verilog Environment for System Level Verification", Proc. 1998 Inter. Verilog HDL Conf. and VHDL Inter. Users Forum, pp. 165–170, Mar. 1998.*

Herman, P., "A Strategy for C–Based Verification", Proc. 1998 Inter. Verilog HDL Conf. and VHDL Inter. Users Forum, pp. 120–127, Mar. 1998.*

Marantz, J., "Enhanced Visibility and Performance in Functional Verification by Reconstruction", Proc. 35th Annual Conf. on Design Automation, pp. 164–169, Jun. 1998.*

Wan et al., "VHdbx: An X Window System Based High–Level Debugger for the VHDL Simulation Environment", Fourth Inter. Conf. on Solid–State and Integrated Circuit Technology, pp. 358–360, Oct. 1995.*

Jung et al. "Integrated Interconnect Circuit Modeling for VLSI Design" Proc. '95 Design Automation Conf., pp. 165–169, 1995.*

* cited by examiner

Primary Examiner—Kevin J. Teska
Assistant Examiner—Douglas W. Sergent
(74) Attorney, Agent, or Firm—Law Offices of Terry McHugh

(57) ABSTRACT

A method and apparatus for managing simulation results involves identifying distinct transactions in a group of simulation results so that the simulation results can be stored and viewed on a transaction basis instead of as a single continuous block of simulation results. A transaction is defined as a specific sequence of transitions on a selection or grouping of signals over a period of time where the signal activity has some higher level operational meaning. Simulation results are recorded on a transaction basis by storing standard simulation results information along with transaction-specific data elements, including the name of the transaction, the start time of the transaction, the end time of the transaction, and the interface on which the transaction takes place. Additional transaction-specific data elements may include parent and child relationships and predecessor and successor relationships between transactions. In addition to recording simulation results on a transaction basis, simulation results are also graphically displayed on a transaction basis in a manner that allows for quicker and more intuitive analysis and debugging of simulation results.

20 Claims, 9 Drawing Sheets

__US 6,263,301 B1__

METHOD AND APPARATUS FOR STORING AND VIEWING DATA GENERATED FROM A COMPUTER SIMULATION OF AN INTEGRATED CIRCUIT

TECHNICAL FIELD

The invention relates generally to managing the data generated from a computer simulation of an integrated circuit (IC) and more particularly to a technique for storing and viewing data that is generated from a computer simulation of IC operation.

BACKGROUND ART

A single IC may include millions of individual devices, such as transistors, capacitors, and resistors, formed on one chip to perform desired functions. Production of such complex ICs is an intricate process that involves many steps. One of the first steps in producing an IC involves designing a virtual version of the IC using computer-aided design tools. The design of a virtual version of an IC can be broken down into three general areas: design definition, design verification, and design layout. IC design definition can be described at various levels of sophistication or detail. The levels of design sophistication include the functional level, also referred to as the register transfer level (RTL) or the architectural level; the logical level, also referred to as the gate level; and the transistor level, also referred to as the layout level.

Known design environments commonly utilized at the functional design level involve one of two major hardware design languages, Verilog or VHDL. To minimize the cost of design errors, the functional design of an IC is put through a verification process to identify and correct functional design problems before the IC is laid out and fabricated. An old technique for design verification involves performing a computer simulation of a virtual design of the IC and applying a known series of input data, also known as verification vectors, to the inputs of the IC. The simulation then simulates the expected outputs that the IC would physically generate. The design is verified by a design engineer studying the simulated outputs of the IC to determine if the IC is functioning correctly.

The described prior art technique of design simulation at the functional level requires a large volume of verification vectors. As the complexity of an IC grows, the volume of verification vectors grows exponentially in relation to the number of gates in the IC. This large volume of verification vectors is difficult to manage in terms of an engineer being able to generate the vectors and analyze the vectors. As IC designs and IC verification have grown more complex, the task of generating and analyzing verification vectors is being replaced by more automated processes.

A known technique for generating, managing, and analyzing the growing volume of verification vectors involves including verification software in the simulation software. The verification software generates the verification vectors that are input into the virtual IC that is being simulated. In addition, the verification software examines the output of the virtual IC being simulated for correct behavior. The added verification software is often in the form of bus functional models. That is, the verification software simulated along with the IC mimics and verifies the correct functioning of buses that comprise inputs and outputs to the IC. A bus is a collection of signals that together carry data in and out of ICs. An interface to an IC is a collection of buses, data signals, and control signals that connect to the IC and together perform some data transfer operations in or out of the IC. A bus functional model is a software representation of an interface to an IC. A bus functional model typically interacts with an IC during a simulation by sending data to and receiving data from the IC during the simulation. Bus functional models can be written which send a large body of defined data to an IC, and they can also be written to verify that interfaces are receiving some expected data in a fashion that conforms to the specification of how the interface is supposed to operate. In this way, bus functional models can both generate and verify simulation vectors that are sent to and received from the simulated IC.

FIG. 1 is a high level representation of a simulation unit 10 that utilizes a bus function model 12 to interact with a virtual IC 14 during simulation. The bus functional model along with the IC being simulated together generate simulation results over the course of the simulation. The simulation results are then stored in a simulation results database 18 for future use. The simulation results typically flow from the simulation unit in a stream of data and then are stored in the database. FIG. 2 is an example of a waveform display of simulation results that includes a clock signal 30, three variables X, Y, and Z, and their associated variable values 32, 34, 36 as a function of time. As can be seen from the waveform display of FIG. 2, the waveforms do not easily identify the specific operations that are being performed at any point in time.

Although simulation results in some prior art simulations are broken down into bus functional models, there are many suboperations that occur during the operation of a bus functional model that cannot be readily located in a database or viewed for analysis. As a result, large volumes of simulation results are stored and viewed as one continuous group of verification vectors as shown in FIG. 2, thereby making the simulation results difficult to analyze and use for debugging.

In view of the large volume of simulation results that must be analyzed to detect and correct design flaws in the virtual design of an IC, what is needed is a method and apparatus that allow simulation results to be more easily analyzed.

SUMMARY OF THE INVENTION

A method and apparatus for managing simulation results involve identifying distinct transactions within a group of simulation results so that the simulation results can be stored and viewed on a transaction basis, instead of as a single continuous block of simulation results. In a preferred embodiment of the invention, transaction-specific data, related to the identified distinct transactions within the simulation results, is stored into a database. The stored transaction-specific data is then utilized to graphically display the simulation results such that individual transactions identified within the simulation results are graphically distinct. Raising the level of abstraction of simulation results from cycles and signals to transactions enables easier simulation analysis and debugging.

In the preferred embodiment, a transaction is defined as a specific sequence of values on a grouping of signals over a period of time in which the signal activity has some higher level operational meaning. For example, a transaction may be comprised of a single operation such as a read operation or a write operation. In accordance with the preferred embodiment of the invention, standard simulation results are augmented to provide transaction-specific information by storing transaction specific data elements. The standard data elements generated from a computer simulation include any variable names involved in the transaction, the variable values related to the variable names, and the time values that are related to the variable values. The variable name is an identifier that identifies the particular signal that is being generated and monitored. The variable value is the value of a named variable at a given point in time, and the time values are the times when the variables change values during a simulation, The transaction-specific data elements that are recorded in association with a simulation event include the name of the transaction, the start time of the transaction, the end time of the transaction (alternatively, the duration of the transaction), and the interface on which the transaction takes place. The name of the transaction identifies the transaction and preferably indicates the type of transaction as, for example, a read transaction or a write transaction. The start time and the end time identify when a particular named transaction begins and ends and the interface refers to what interface the transaction takes place on, for example, a collection of pins.

Another transaction-specific data element that can be recorded during a simulation in accordance with the invention is the relationship between transactions. There are two fundamental relationships of particular interest between transactions, the parent/child and successor/predecessor relationships. First, the parent and child relationship between transactions is a relationship in which the child transaction is a sub-transaction that comprises part of a larger transaction for the parent. Second, the successor and predecessor relationship between transactions is a relationship in which the predecessor transaction has some association with the successor transaction or causes the successor transaction to execute.

All of the above-identified standard data elements and transaction-specific data elements are recorded into a simulation results database during a simulation for future recall in accordance with a preferred embodiment of the invention. In order to record transaction information into the simulation results database, additional transaction software needs to be linked into the simulation system. The additional transaction software provides specific calls that bus functional models use to identify the names of transactions, the start and end of transactions, and the parent/child and successor/predecessor relationships between transactions. Alternatively, the transaction can also automatically determine and record parent/child and successor/predecessor relationships between the transactions as they occur in the course of the simulation.

An additional aspect of the invention involves the display of simulation results that have been recorded into a database with the above-identified transaction-specific data elements. In order to facilitate the analysis and debugging of simulation results, in accordance with another preferred embodiment of the invention, the simulation results are displayed on a transaction basis with a prominent display of the desired transaction-specific data elements associated with each transaction. One approach for displaying simulation results involves graphically displaying transaction simulation results in a waveform display and another approach involves displaying the transaction simulation results in a register display.

The waveform display approach for graphically displaying transaction simulation results displays transactions in "transaction boxes," in which each transaction box represents one transaction. Transaction boxes allow the relationship between transactions to be easily recognizable. Specifically, transaction boxes allow parent and child transaction relationships and predecessor and successor transaction relationships to be viewed in an easily recognizable format. In the parent and child transaction relationship, child transactions are located directly beneath parent transactions and the child transactions are connected in such a way that the relationship is easy to recognize. The transaction waveform display approach allows multiple "generations" of transactions to be displayed at the same time. In the preferred embodiment, the height of a transaction waveform display is controlled by a height bar located at the left of a block window where the height bar is implemented with some graphical indicator to indicate when there are additional levels of transactions available to be displayed. To identify the predecessor and successor relationship between transactions, a particular transaction is identified as the selected transaction and then a request is made to identify related transactions, such as "highlight predecessor transaction." Any transactions that meet the designated request are then highlighted for easy recognition.

The second approach to displaying transaction-based simulation results involves displaying the simulation results in a transaction-based register display. The register display is preferably the size of one computer screen, and the display has an arrangement of data element labels and open fields. The data element labels may include the transaction name, the interface name, the transaction start time, and the transaction end time. Associated with each label is an open field that is filled from the database that holds the transaction-based simulation results. The register display preferably has a graphical user interface, and associated functionality allows data queries to be conducted in order to display the desired data in the open fields.

In addition to the recording and displaying of simulation results on a transaction basis, in another alternative embodiment of the invention, simulation errors can also be recorded and displayed on a transaction basis. Transaction-specific data elements involved with recording errors include an error name, or descriptor, the properties of the error, the time of the error, and the interface on which the error occurred. In a preferred embodiment of the invention, the transaction-specific error data is recorded with the simulation results in a manner similar to the recording of the above-identified transaction-specific data elements. Recording simulation errors on a transaction basis allows errors to be identified in relation to the transaction in which the errors occurred.

An advantage of the invention is that recording and displaying simulation results on a transaction basis allows a level of simulation results abstraction that was not previously available. The higher level of abstraction allows simulation results to be analyzed and debugged with less effort than was required to analyze the larger volume of underlying simulation results. In addition, the graphical nature of the transaction-based waveform display allows quick and easy recognition of transactional relationships, which in turn allows for easier data analysis and debugging.

DETAILED DESCRIPTION

Figure 1:
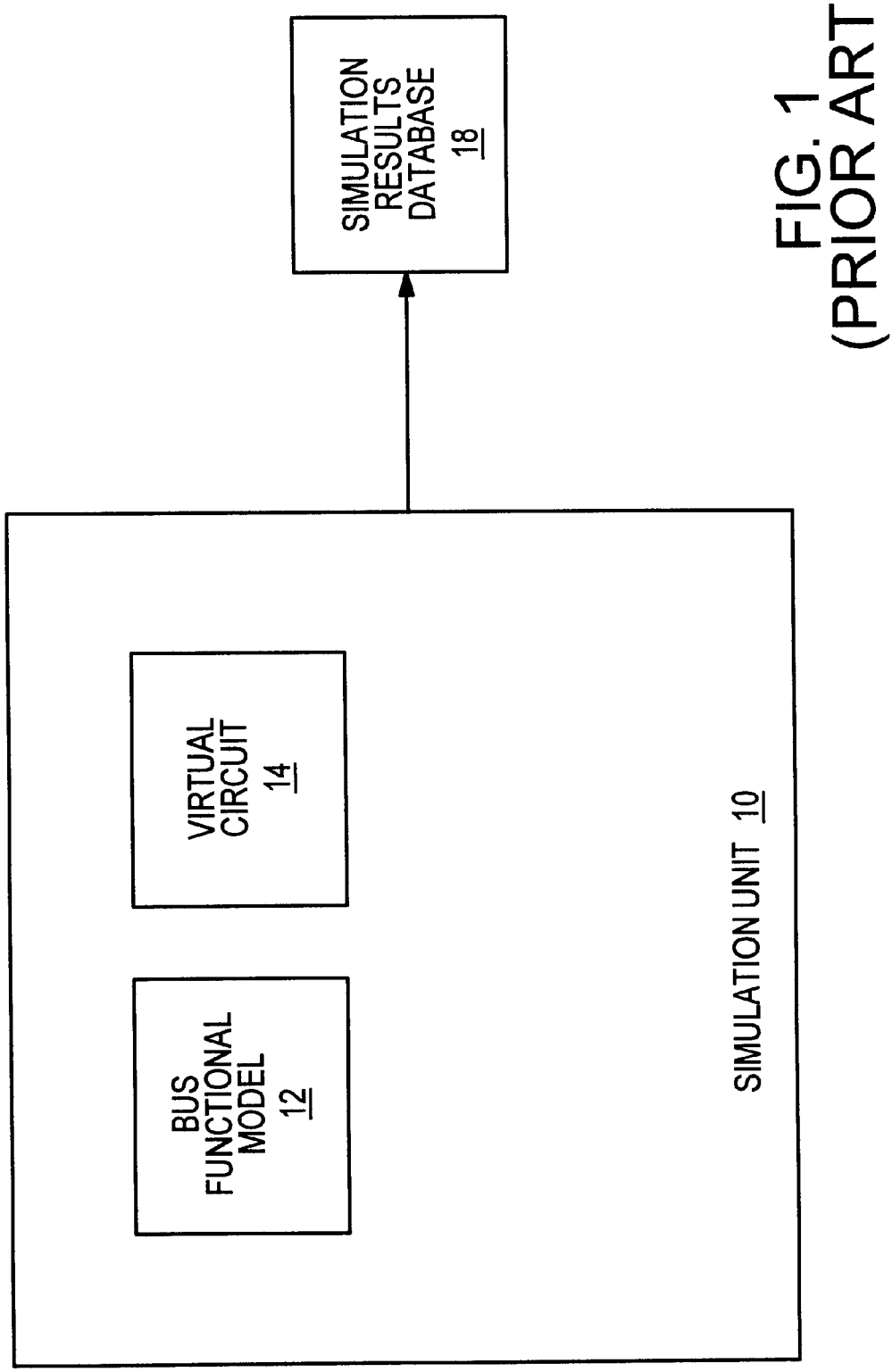
FIG. 1 is a high level representation of a simulation system that utilizes a bus functional model in accordance with the prior art.
Figure 2:
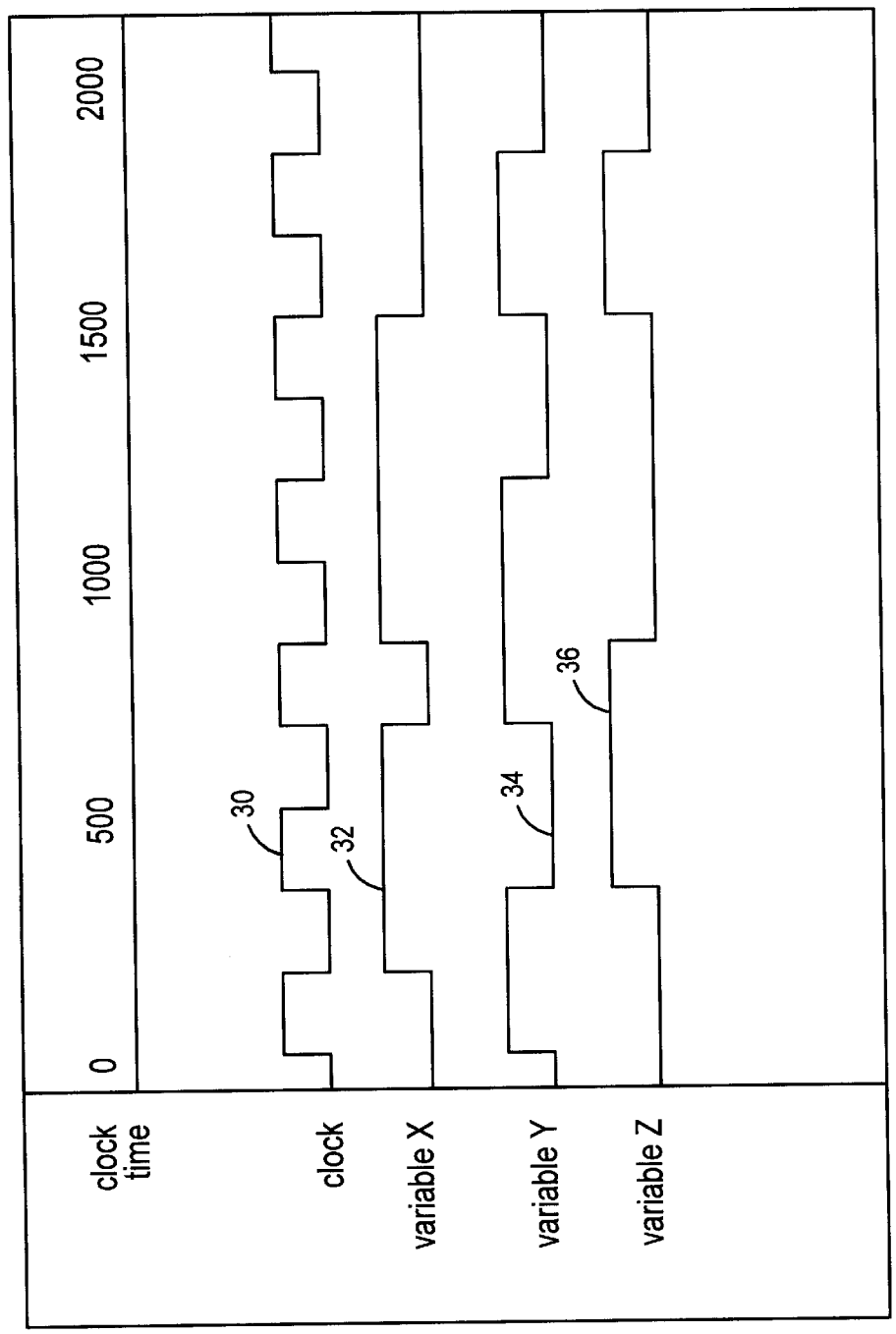
FIG. 2 is a depiction of simulation results that include variable values versus time values in accordance with the prior art.

Bus functional models are used to simulate the bus level operation of an IC design at the interface between the IC and the outlying environment. Bus functional modeling is a simulation technique that breaks operations down into functional transactions. A "transaction" is defined herein as a specific sequence of transitions on a collection or grouping of signals (representing a physical interface) over a period of time where the signal activity has some higher level operational meaning. For example, a transaction may be comprised of a single operation such as a read operation, a write operation, or some other kind of finite operation that is carried out as part of a bus functional model through multiple pin connections. A complete list of the types of transactions that are supported by a given interface and the specific sequences and rules governing the transactions are defined by interface specific protocols.

In simulations that utilize bus functional models, simulation results typically consist of some standard data elements. The standard data elements generated from a computer simulation of an IC include any variable names involved in the transactions, the variable values related to the variable names, and the time values that are related to the variable values. The variable name is an identifier that identifies the particular signal that is being generated and monitored. The variable value is the value of a named variable at a given point in time, and the time values are the points at which the variable values are obtained during the simulation.

In addition to the basic elements recorded during a simulation, in accordance with a preferred embodiment of the invention, transaction-specific data elements are also recorded in association with a simulation event. The transaction-specific data elements include the name of the transaction, the start time of the transaction, the end time of the transaction (alternatively, the duration of the transaction), and the interface on which the transaction takes place. The name of the transaction identifies the transaction and preferably indicates the type of transaction as, for example, a read transaction or a write transaction. The start time and the end time identify when a particular named transaction starts and ends. The interface refers to what interface the transaction takes place on, for example, what pins or bus channel carries the signal.

Another transaction-specific data element that can be recorded during a simulation in accordance with the invention is the relationship between transactions. There are two fundamental relationships between transactions, parent/child and successor/predecessor, that are of particular interest. First, the parent and child relationship between transactions is a relationship in which the child transaction is a sub-transaction that takes care of part of a larger transaction for the parent. A parent transaction may have more than one child transaction and a child transaction may also be the parent transaction to its own child transactions. In sum, the parent and child relationship defines a hierarchy of primary transactions and related subtransactions which combine to create the primary transaction. Second, the successor and predecessor relationship between transactions is a relationship in which the predecessor transaction causes, enables, or in some way is associated with the successor transaction. In the predecessor and successor transaction relationship, it is not necessary for the predecessor transaction to complete its transaction before the successor transaction begins.

All of the above-identified transaction-specific data elements are continuously recorded into a database for future recall in accordance with a preferred embodiment of the invention. In order to enable the transaction-specific data elements to be recorded, some of the transaction-specific data elements can be identified through user input calls that are embedded into the active bus functional model or set of models. For example, some of the data elements that can be identified through user input calls include the name of a transaction, the variables associated with a transaction, and the relationship of one transaction to another transaction.

In a preferred embodiment, user input calls are embedded into a bus functional model utilizing Verilog as described below. The embedding of user input calls is described in terms of basic transactions, parent/child transactions, and predecessor/successor transactions. To begin with, the function;

$thread (<interface_name>)

declares the name of an interface and is typically used if more than one interface is in a single bus functional module.

Basic Transactions

In Verilog a $display call is used to log specific information about bus functional model activity into a log file. The $display call can be replaced with a $trans_display call which takes the same arguments.

$trans_display (<format>, <args> ... <format>, <args> ... )

Preferably, $trans is the primary transaction call. While slightly incompatible with $display, $trans has an advantage over $trans_display in that property assignments and options can be used in the call. For example;

$trans (<tag>, <description>, <options>, <property assignments>)

where the <tag> and <description> fields of the call can be string literals or interpolated format strings. The following call format also works;

$trans (<tag format>, <args>. . . , <description format>, <args>. . . , <options>, <property assignments>)

The calls $trans_event and $trans_error are two other functions that can be used for marking and recording transactions where both of these functions take the same arguments as $trans. $Trans_event generates a child transaction with a duration of zero and is useful for supplying time-specific properties to the parent transaction of the child. $trans_error also generates a zero length child transaction that is used to identify errors as further described below.

Parent/Child Transactions

The calls $Trans_begin and $trans_end are used for creating disjoint transactions or for building transaction hierarchies such as parent/child relationships. $Trans_begin takes the same arguments as $trans and $trans_end does not take a tag or a description, but can be used to set properties on the current transaction before ending it. The following is an example of calls that define a parent/child relationship between transactions;

```
$trans_begin A_begin ("burst_read");
$trans_begin ("init");
B#5;// do some stuff
$trans_end;
for(i=0;i<4;i=i+1) begin
    $trans_begin ("byte%d", i);
    C#10/ do some more stuff
    $trans_end
end
$trans_end A_end
```

The "_begin" call signals that the next $trans call is a child transaction that continues until the "_end" call that is associated with the "_begin" call is executed.

Predecessor and Successor Transactions

The calls used to record predecessor and successor transactions on interacting interfaces preferably include;

```
id=$get_id;
$add_predecessor (id);
$clear_predecessors;
```

A transaction id can be obtained by using the $get_id call. An id that is saved in a buffer or a queue can then be passed along to another interface where the $add_predecessor call completes the association. All transactions created after the $add_predecessor are associated with the instigating transaction. The use of $clear_predecessors removes the association with any predecessors. The following is a simple example that illustrates how the connection between an interface A (bfm_src) and an interface B (bfm_sink) is achieved.

```
module top;
    wire clk;
    wire [31:0] front_pipe;
    wire [31:0] back_pipe;
    bfm_src u2 (clk, front_pipe);
    queue u3 (clk, back_pipe, front_pipe);
    bfm_sink u4 (clk, back_pipe); endmodule
module bfm_src (clk, pipe);
    input clk;
        output pipe;
        reg [31:0]pipe;
        integer n;
    always @ (posedge clk) begin
        $trans_display ("src%d", n);
        n=n+1;
        pipe=$get_id; end
endmodule
module bfm_sink (clk, pipe);
        input clk;
        input pipe;
        wire [31:0]pipe;
        integer n;
        always @ (negedge clk)
            begin
                if (pipe >0)
                begin
                n=n+1;
                $add_predecessor_id (pipe);
                $trans_display ("sink%d", n);
                $set_property ("size=", n*2);
                $clear_predecessors;
            end
endmodule
```

The call $trans_ display ("src%d",n) records a transaction for interface A. The call pipe=$get_id gets the transaction id of the transaction on interface A and stores the id in the "pipe" variable. The $add_predecessor_id (pipe) adds the transaction id stored in the "pipe" variable to a list of predecessors for transactions subsequently recorded for interface B. The $trans_display ("sink%d",n) call records a transaction for interface B and the $clear_predecessors call clears the list of predecessors for interface B.

Properties

The $trans call can also be used to associate properties with transactions. An example call for use in the "properties" option includes;

```
$trans ("read",
    "addr=", addr,
    "data=", data);
```
Note the equal sign (=) after the property name. This clearly identifies the argument as a property name. The equal sign does not become part of the property name. The <Tag>(in this case "read") is an interpolated string that forms the transaction tag. Other interpolated strings are optional, but if specified, are all concatenated together to form a description property. The transaction begins at the time of the $trans call. The transaction ends and another transaction is begun when the next $trans call is encountered. If disjoint or nested (children) transactions are needed then the $trans_begin and $trans_end calls are used. A $set_property call can be used to set properties on the current begin transaction, the last transaction created, or other transactional objects.

As an alternative to user input calls, some data elements can be determined automatically at the time of the simulation by software linked into the simulation.

When recording simulation results on a transaction basis, transactions can be defined to have an infinite number of associated variables. In addition, each property (i.e., variable name and associated variable values and time values) may be allowed to consume an indefinite amount of storage in a database. Further, the properties of a transaction can be collected over the entire duration of a transaction and recorded into the database as the information is collected. This allows transactions to illustrate information that is not known until later in the transaction, such as the number of wait states prior to a data transfer acknowledgment, return data, or error indication.

An additional aspect of the invention involves the display of simulation results that have been recorded with the above-identified transaction-specific data elements. In order to better facilitate the analysis and debugging of simulation results, in accordance with another preferred embodiment of the invention, the simulation results are displayed on a transaction basis with a prominent display of the transaction-specific data elements associated with each transaction. Although there are an infinite number of ways that the transaction-based simulation data can be displayed, two preferred approaches involve displaying the data in a manner that intuitively depicts simulation transactions. The first approach involves graphically displaying simulation results in a transaction-based waveform display and the second approach involves displaying simulation results in a register display.

Figure 3:
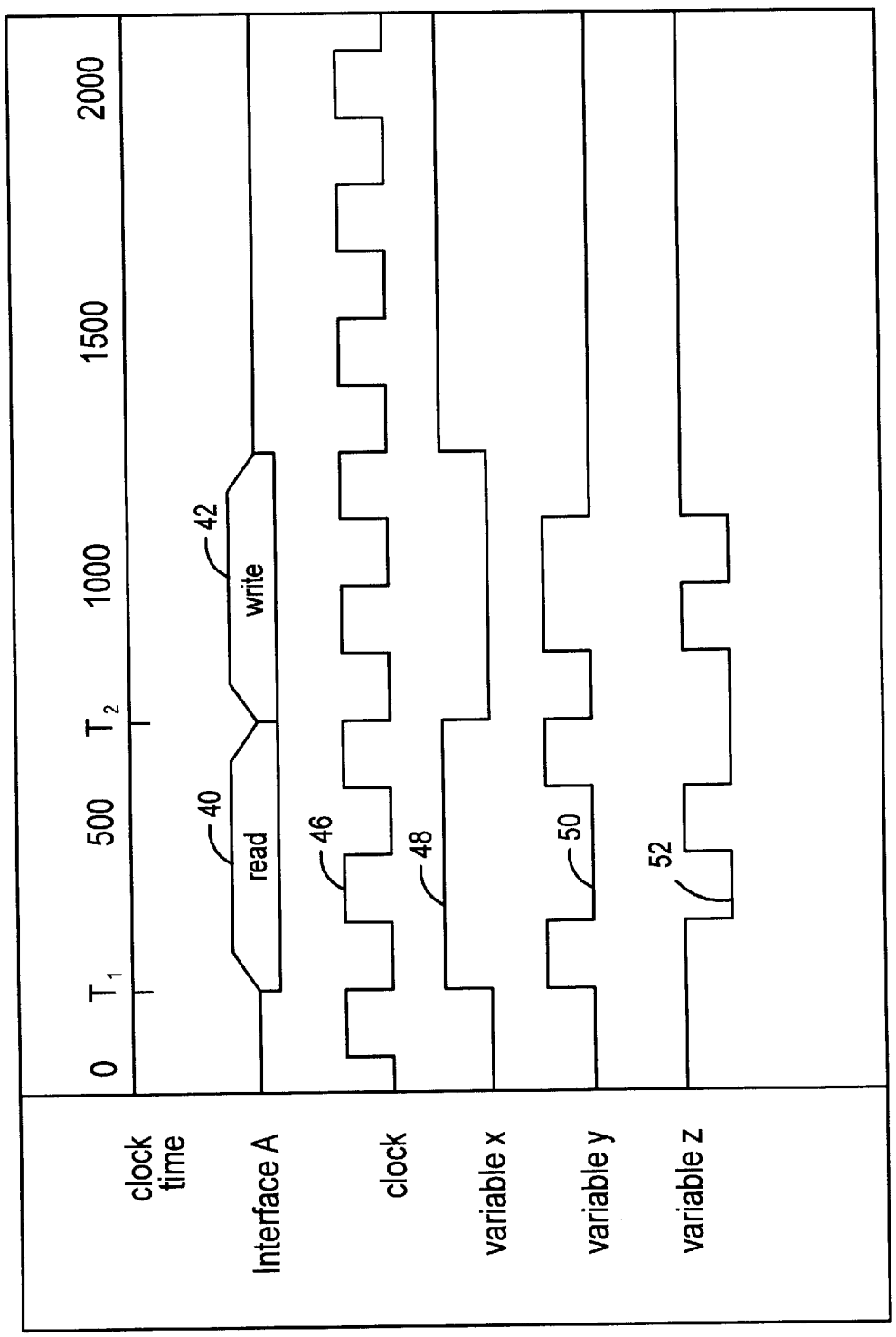
FIG. 3 is a depiction of a transaction waveform display of simulation results in accordance with the invention.

FIG. 3 is a depiction of a waveform display that displays the simulation results on a transaction basis in a graphical format in accordance with the invention. The transaction-based waveform display of FIG. 3 includes a read transaction 40 and a write transaction 42 that occur on example interface A. The transaction-specific data elements included in the graphical display of the read transaction are the transaction name (read), the transaction start time ($T_1$), the transaction end time ($T_2$), and the interface that the transaction occurs on (interface A). Standard simulation results that can also be included in the graphical display include the variable names of the signals that are involved in the transaction, the variable values related to the transaction, and the time values for each variable at each time value. The amount of information that is displayed with each transaction is fully adjustable.

The transaction-based waveform display identifies the boundaries of a transaction by placing borders around the transaction to create a "transaction box." In FIG. 3, the borders around the "read" instruction delineate the boundaries of the read transaction 40. The transaction box can be expanded as desired to display more textual information that is specific to the properties of the transaction. The transaction box can be expanded using either a menu option or a visual indicator such as a height bar associated with the transaction, although other methods are possible.

In addition to the display of the read transaction 40 and write transaction 42, the transaction waveform display may include the waveforms generated from the specific signals of the simulation. The waveforms of the specific signals are formed for each variable name by charting variable values versus time values. The variables associated with the read transaction of FIG. 3 include a clock signal 46 and X, Y, and Z signals 48, 50, and 52, where the X, Y, and Z signals are specific to the application of the IC. The clock signal is a signal that represents the time intervals that are defined by operation of a system clock. The variable values of variables X, Y, and Z are recorded at corresponding time values. Displaying variable waveforms within a transaction-based waveform display makes it easy to switch back and forth between the transaction level and the signal level while analyzing simulation results.

Figure 4:
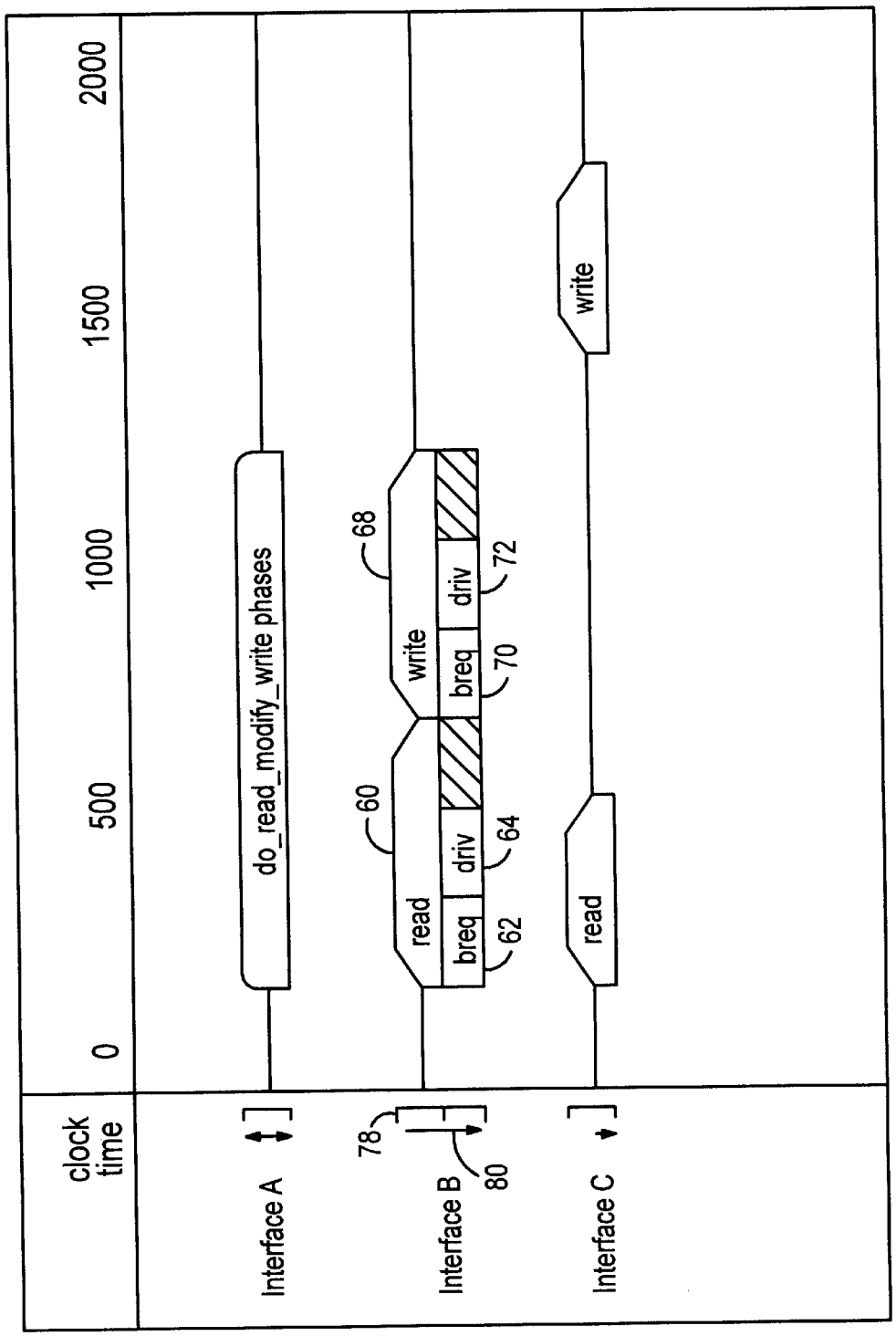
FIG. 4 is a depiction of a transaction waveform display that includes parent and child transactions in accordance with the invention.

FIG. 4 is another depiction of the graphical transaction-based waveform display technique that is provided to show how the parent and child transaction relationship is graphically depicted. FIG. 4 includes three transaction interfaces (A, B, and C), where interface B involves two parent/child relationships. The parent transactions 60 and 68 of interface B are displayed above related child transactions 62, 64 and 70, 72, respectively. Although only two levels of parent/child transactions are depicted, multiple levels or "generations" of transactions can be displayed at the same time. The transaction waveform display approach allows a user to readily visualize the parent and child relationship between transactions because the parent and child transactions are graphically connected. Understanding the parent and child relationship between transactions enables quicker analysis and debugging of an IC simulation.

In a preferred embodiment, the level of transaction waveform display is controlled by a height bar 78 located at the left of a block window. The height bar can be implemented to indicate with an arrow 80 when there are additional levels of transactions available to be displayed. In addition, as shown in FIG. 4, different interfaces (interfaces A, B, and C) can be simultaneously displayed on different horizontal lines to graphically depict the different interfaces that are involved in a simulation.

Figure 5:
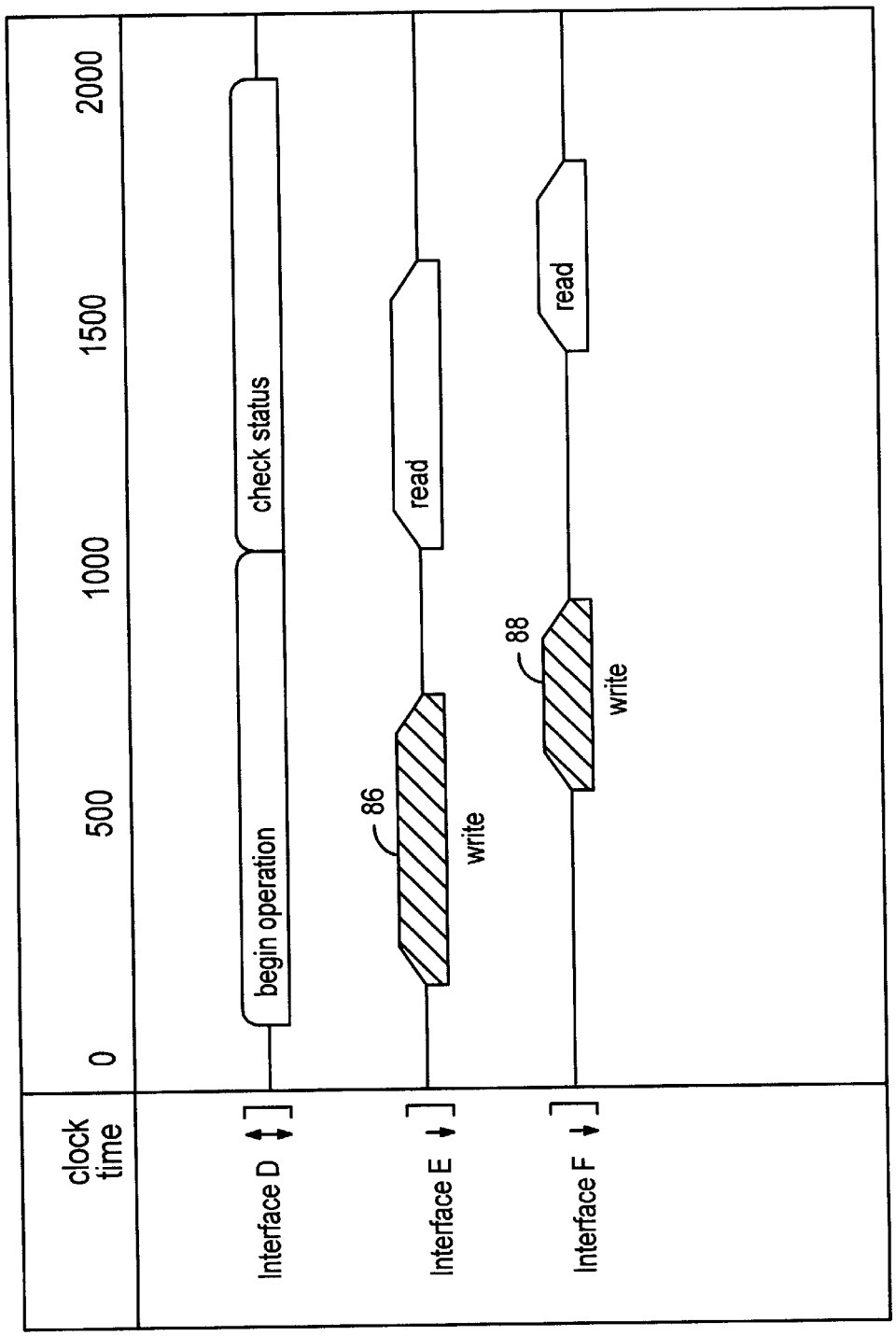
FIG. 5 is a depiction of a transaction waveform display that includes predecessor and successor transactions in accordance with the invention.

FIG. 5 is a depiction of the graphical transaction waveform display approach that highlights the predecessor and successor relationship between transactions, instead of the parent and child relationship. Transactions with predecessor and successor relationships are typically executed on different interfaces, so their relationship is depicted using special markings such as cross-hatching, highlighting, or shading. To identify the predecessor and successor relationship between transactions, a particular transaction is identified as the selected transaction and then a request is made to identify related transactions, such as "highlight predecessor transaction," "highlight successor transaction," "highlight related transactions" (i.e. transactions that have the same predecessor), or other similar operations. Any transactions that meet the request are then highlighted for easy recognition. For example, referring to FIG. 5, when a write transaction 86 from interface E is selected and then successor transactions are requested, the successor write transaction 88 from interface F is highlighted. Understanding the predecessor and successor relationship between transactions enables quicker analysis and debugging of an IC simulation.

Additional functions that can be incorporated into the transaction-based waveform display approach include a transaction-to-source code cross-referencing function and an edge-to-transaction cross-referencing function. The transaction-to-source code cross-referencing function involves selecting a specific transaction and then causing the associated source code of the original test to be shown with the region of the source code belonging to the specific transaction being highlighted. The transaction-to-source code cross-referencing function allows simulations to be analyzed by relating transactions back to the source code that enabled the transaction. The edge-to-transaction cross-referencing function involves selecting a specific transition of a variable value, or edge, on a signal that belongs to a given interface, and then causing the transaction that describes the signal's function to be highlighted. The edge-to-transaction cross-referencing function allows simulations to be analyzed by relating signal transitions back to the transaction that describes the interface's activity.

Figure 6:
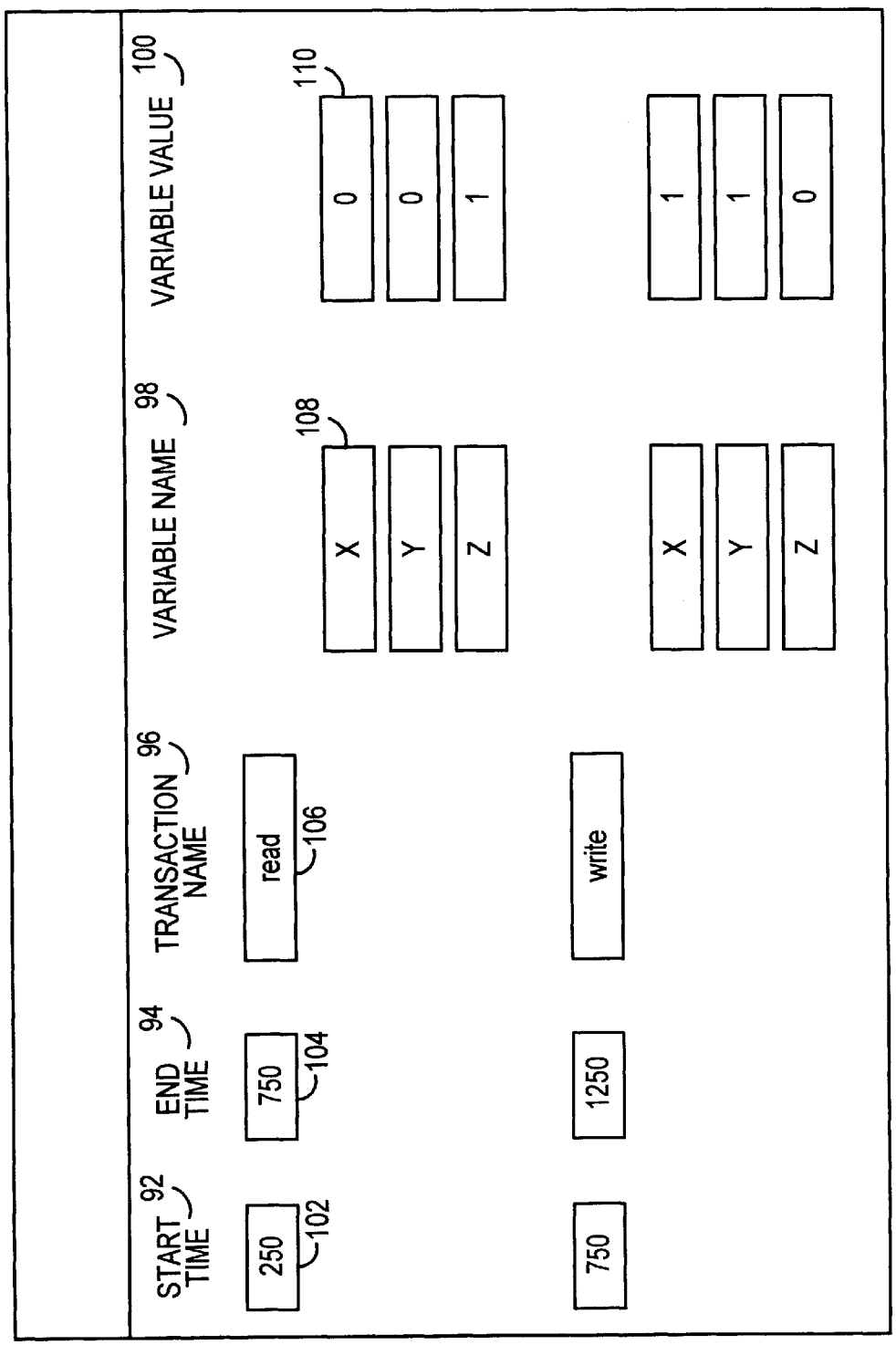
FIG. 6 is a depiction of a transaction-based register display in accordance with the invention.

As stated above, the second approach to displaying transaction-based simulation results involves displaying the simulation results in a transaction-based register display. FIG. 6 is a depiction of an exemplary transaction-based register display that shows a read transaction and a write transaction. The register display is preferably the size of one computer screen and the display has an arrangement of data element labels 92 94, 96, 98, and 100 and open fields 102, 104, 106, 108, and 110. The data element labels may include the transaction name, the transaction start time, the transaction end time, the variable names and the associated variable values. Associated with each label is an open field that is filled from the database that holds the transaction-based simulation results. The register display preferably has a graphical user interface and associated functionality that allows data queries to be conducted in order to display desired data in the open fields. The labels and the associated open fields can be customized to display the desired amount of information on a particular transaction. Additional features of the register display allow the simulation results to be paged through on a time basis, categorized by transaction type or interface and/or the display of related transactions such as parent/child and predecessor/successor.

In addition to the recording and displaying of simulation results on a transaction basis, in another alternative embodiment of the invention, simulation errors can also be recorded and displayed on a transaction basis. Transaction-specific data elements involved with recording errors include an error name, or descriptor, the properties of the error, the time of the error, and the interface on which the error occurred. In a preferred embodiment of the invention, the transaction-specific error data is recorded with the simulation results in a manner similar to the recording of the above-identified transaction-specific data elements. Recording simulation errors on a transaction basis allows errors to be identified in relation to the transaction where the error occurred.

Enhancements to transaction-based error recording include recording a count of errors that occur on each interface, recording a count of errors for each test that is run on a system, and recording a count of the total errors in a simulation period. The additional error recording allows simulation errors to be quickly identified during simulation results analysis.

With simulation errors recorded on a transaction basis, simulation errors can be graphically displayed on a transaction basis. For example, utilizing the transaction-based waveform display approach, errors are graphically depicted in the affected transaction box by, for example, placing a solid half-circle in the transaction box of a transaction that reports an error and by placing a hollow half-circle in the transaction box for any parent transaction of a transaction that reported the error.

Figure 7:
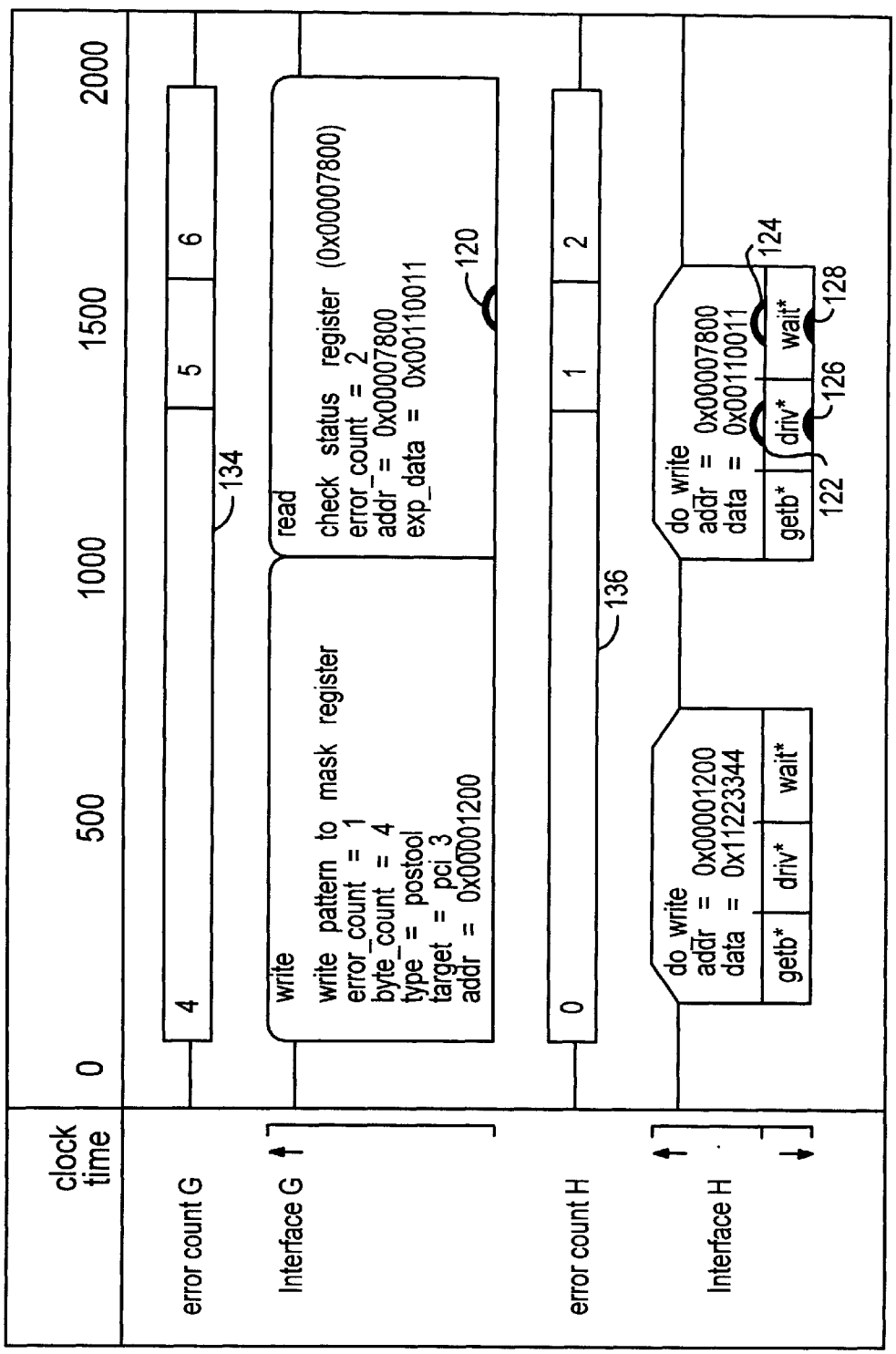
FIG. 7 is a depiction of a transaction waveform display that identifies errors on a transaction basis in accordance with the invention.

FIG. 7 is a depiction of a transaction-based error display that shows graphical error identifiers 120, 122, 124, 126, and 128 for parent and child transactions. The error marks are located at the simulation time that the error was recorded into the database. In addition to graphically displaying transactions with errors, error counts can be displayed in error bars 134 and 136 on an interface basis, test basis, and/or global basis. The error count can be shown to increment at the time of an error, or coincident in time with an error mark. The error counts enable a user to find where an error occurred, even if the transaction detecting the error is not displayed.

Additional transaction-based error display functions include an error to transaction function. In the error to transaction function, a transition in one of the error bars 134 and 136 (for example the point at which the global error count transitions from "0" to "1") is selected and then various operations can be initiated on the selected transition through a menu option. For example, a show erroneous transaction function will highlight the transaction that detected the error. In addition, the transaction that caused an error can be highlighted by selecting the transaction that reported an error and then initiating a show related transaction function. The transactions that are highlighted as a result are all the predecessor and successor transactions of the selected transaction.

Figure 8:
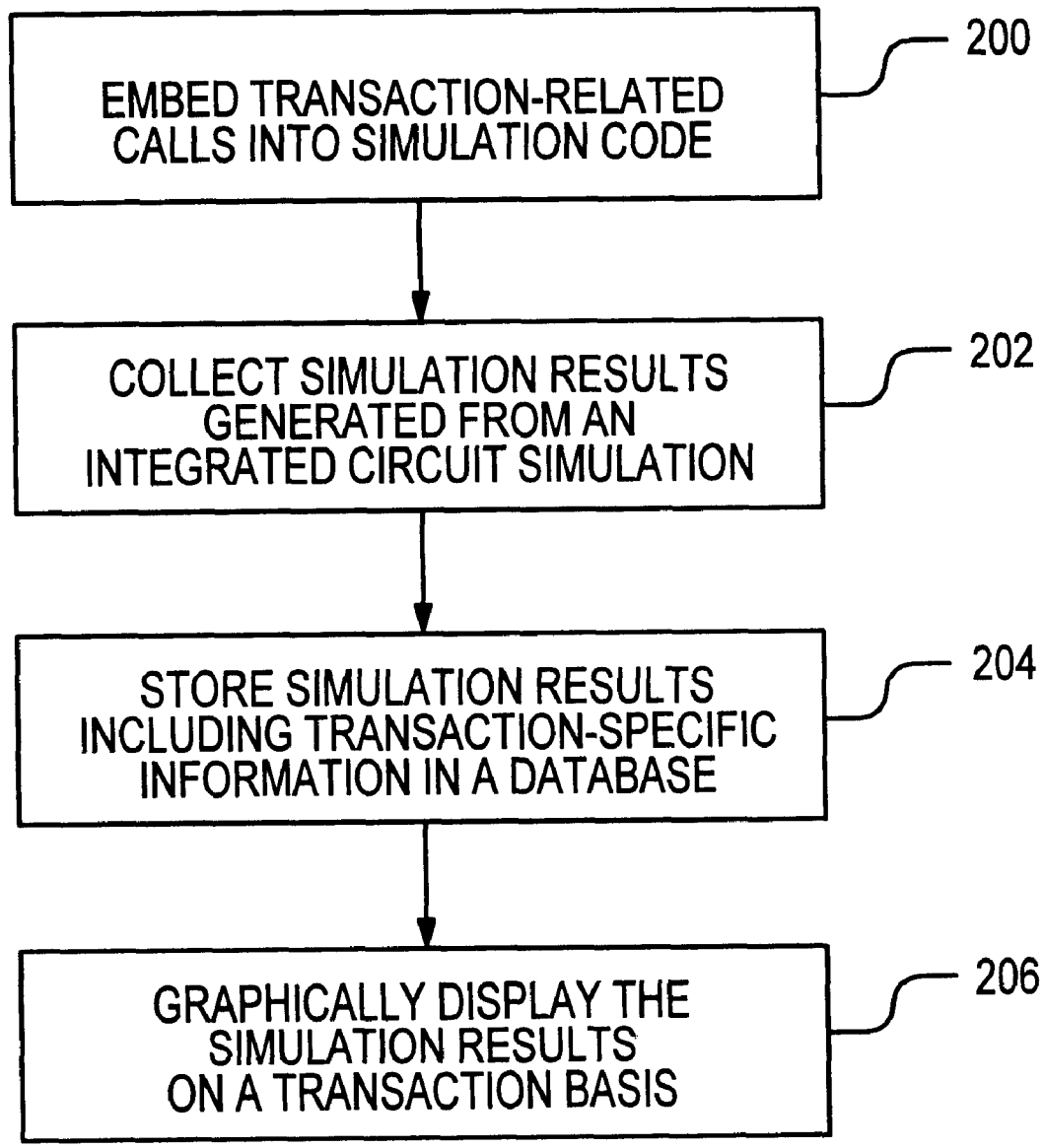
FIG. 8 is a process flow diagram of the basic steps for managing simulation results in accordance with the invention.

FIG. 8 is a process flow diagram for the basic steps of the preferred method for storing and viewing simulation results in accordance with the invention. In a first step 200, transaction-related calls are embedded into simulation code where the transaction-related calls relate to transactions that occur during simulation of an integrated circuit. In a next step 202, simulation results generated from the integrated circuit simulation are collected. In a next step 204, the simulation results including transaction-specific information are stored in a database. As an additional step 206 to the preferred embodiment, the simulation results are graphically displayed on a transaction basis to enable simulation analysis and debugging.

Figure 9:
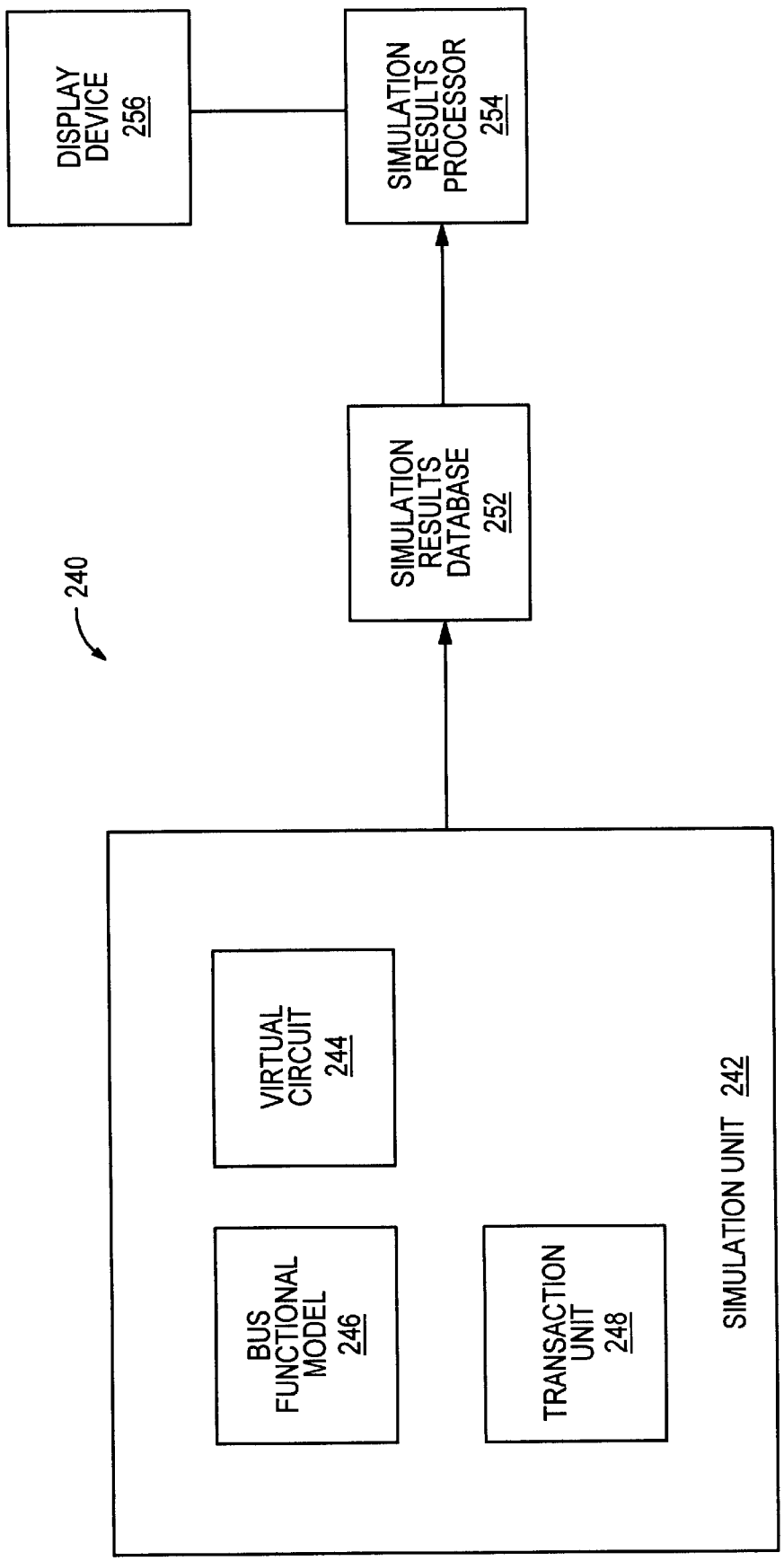
FIG. 9 is a depiction of a computer system for managing simulation results in accordance with the invention.

FIG. 9 is a depiction of the preferred architecture of a computer system 240 which is able to carry out the preferred method of FIG. 8. Within a computer simulation unit 242, a virtual circuit 244, a bus functional model 246, along with a transaction unit 248 designed to collect information about transactions in the simulation, are all operated together. The simulated behavior of the virtual circuit generates a part of simulation results that are output from the simulation unit. The simulated behavior of the bus functional model 246 also contributes to the simulation results. The transaction unit collects transaction related information throughout the course of the simulation which is also part of the simulation results. The simulation results are stored in a simulation results database 252. The simulation results database is a software database that stores all of the simulation results that are collected from the computer simulation unit. A simulation results processor 254 takes the data from the simulation results database, and processes that data for convenient display in a software window which is typically viewed on a conventional display device 256. The simulation results processor receives commands through the software window typically in the form of keystrokes and mouse movements to change the data and how it is displayed.

What is claimed is:

1. A method for managing simulation results from the simulation of a virtual integrated circuit comprising the steps of:

embedding transaction-related calls into simulation code that is specific to executing said virtual integrated circuit simulation, where said transaction-related calls relate to transactions that occur during said virtual integrated circuit simulation;

running said simulation code having said transaction-related calls so as to execute said virtual integrated circuit simulation, including generating simulation results as responses to running said simulation code;

continuously collecting said simulation results generated from said virtual integrated circuit simulation, wherein said simulation results include embedded transaction-specific information that is generated as automated responses to said embedded transaction-related calls; and continuously storing said simulation results into a database.

2. The method of claim 1 wherein said steps of continuously collecting and storing simulation results include collecting and storing transaction-specific data elements for a specific transaction, wherein said transaction-specific data elements are a subset of said transaction-specific information, said transaction-specific data elements including:

a name of said specific transaction;

a start time of said specific transaction;

an end time or duration of said specific transaction;

an interface on which said specific transaction takes place;

names of variables associated with said specific transaction; and variable values for each named variable associated with said specific transactions at identified times.

3. The method of claim 1 further including a step of graphically displaying said simulation results and said transaction-specific information such that distinct transactions are graphically distinct.

4. The method of claim 2 further including a step of storing error identifiers related to said identified distinct transactions.

5. The method of claim 1 further including a step of graphically displaying said transaction-specific information in a waveform display that includes waveforms generated from signal-specific simulation results.

6. The method of claim 5 further including steps of:

expanding said graphical display of said transaction-specific information to show more detailed information about said transactions; and utilizing a visual element to indicate when said more detailed information about said transactions is available.

7. The method of claim 5 wherein said step of graphically displaying said transaction-specific information includes a step of displaying transactions associated with a same interface on a same horizontal line of said graphical display.

8. The method of claim 5 further including a step of identifying source code that is related to a selected transaction that is graphically displayed.

9. The method of claim 1 further including a step of displaying in textual format said transaction-specific information in a register display along with the text values of said simulation results.

10. An apparatus for storing and viewing simulation results from a computer simulation of an integrated circuit comprising:
   means for generating transaction-specific information in conjunction with simulation results where said transaction-specific information relates to distinct transactions that occur during a simulation of an integrated circuit;
   means for storing said simulation results and said transaction-specific information related to said distinct transactions;
   means for displaying said simulation results and said transaction-specific information related to said distinct transactions such that said distinct transactions are uniquely identified; and
   means for identifying parent and child relationships between said distinct transactions, each said parent and child relationship including a parent transaction and at least one child transaction that is executed as a sub-transaction of said parent transaction.

11. The apparatus of claim 10 further including a means for graphically displaying said transaction-specific information related to said distinct transactions in a waveform display that includes waveforms generated from individual signals identified within said simulation results.

12. The apparatus of claim 10 further comprising means for graphically displaying said parent and child relationships between said distinct transactions.

13. The apparatus of claim 10 further comprising means for identifying and graphically displaying predecessor and successor relationships between distinct transactions, each said predecessor and successor relationship including a predecessor transaction and a successor transaction which is enabled by accessing said predecessor transaction.

14. The apparatus of claim 10 wherein said means for generating includes software calls that are embedded into simulation code that enables said computer simulation of said integrated circuit.

15. A method for storing and viewing data generated from the simulation of a virtual integrated circuit comprising steps of:
   embedding transaction-identification commands into simulation code that is utilized to initiate and execute simulation of a virtual integrated circuit;
   continuously recording simulation results from said simulation of said virtual integrated circuit, including embedding into said simulation results transaction-specific information that is generated in automated response to said transaction-identification commands that are embedded into said simulation code; and
   displaying said simulation results on a transaction basis utilizing said recorded transaction-specific information.

16. The method of claim 15 wherein said step of displaying includes a step of graphically displaying distinct transactions as transaction boxes wherein a single transaction box visually identifies a single one of said distinct transactions.

17. The method of claim 16 wherein said step of graphically displaying distinct transactions includes a step of graphically associating related transactions such that a transaction relationship is visually identifiable, said transaction relationship being at least one of a parent/child relationship and a predecessor/successor relationship.

18. A method for managing simulation results from the simulation of an integrated circuit comprising the steps of:
   embedding transaction-related calls into simulation code where said transaction-related calls relate to transactions that occur during said integrated circuit simulation, including embedding transaction-related calls that relate to transaction relationships between a first specific transaction and a second specific transaction;
   collecting simulation results generated from said integrated circuit simulation, wherein said simulation results include transaction-specific information generated from said embedded transaction-related calls, including collecting transaction-relationship information generated from said transaction-related calls that relate to said transaction relationships; and
   storing said simulation results into a database, including storing said transaction-relationship information generated from said transaction-related calls that relate to said transaction relationships.

19. The method of claim 18 wherein said step of embedding transaction-related calls that relate to said transaction relationships is a step of embedding transaction-related calls that identify at least one of a parent-and-child relationship, and a predecessor-and-successor relationship between said first specific transaction and said second specific transaction.

20. The method of claim 19 further including a step of graphically displaying said transaction relationships.

* * * * *